United States Patent
Tomita

(10) Patent No.: US 9,947,806 B2
(45) Date of Patent: Apr. 17, 2018

(54) SEMICONDUCTOR DEVICE

(71) Applicant: SHINDENGEN ELECTRIC MANUFACTURING CO., LTD., Tokyo (JP)

(72) Inventor: Masaaki Tomita, Hanno (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 15/510,765

(22) PCT Filed: Nov. 5, 2014

(86) PCT No.: PCT/JP2014/079334
§ 371 (c)(1),
(2) Date: Mar. 13, 2017

(87) PCT Pub. No.: WO2016/071969
PCT Pub. Date: May 12, 2016

(65) Prior Publication Data
US 2017/0278983 A1    Sep. 28, 2017

(51) Int. Cl.
*H01L 29/47*    (2006.01)
*H01L 29/872*    (2006.01)
(Continued)

(52) U.S. Cl.
CPC ........ *H01L 29/872* (2013.01); *H01L 21/0237* (2013.01); *H01L 21/02433* (2013.01);
(Continued)

(58) Field of Classification Search
CPC . H01L 29/872; H01L 29/66143; H01L 29/47; H01L 29/0619; H01L 21/02433;
(Continued)

(56) References Cited

U.S. PATENT DOCUMENTS

2009/0098719 A1* 4/2009 Matsuno ............. H01L 21/0495
                                                                                438/572
2012/0302051 A1* 11/2012 Matsuno ............. H01L 29/1608
                                                                                438/571

FOREIGN PATENT DOCUMENTS

JP            56-090565            7/1981
JP            2009-277806          11/2009
(Continued)

OTHER PUBLICATIONS

International Search Report for PCT/JP2014/079334 dated Feb. 3, 2015, 4 pages.
(Continued)

*Primary Examiner* — Thinh T Nguyen
(74) *Attorney, Agent, or Firm* — Nixon & Vanderhye P.C.

(57) ABSTRACT

A Schottky barrier diode (semiconductor device) includes at least: a semiconductor substrate of an N type (first conductivity type); a semiconductor portion (first portion) of a P type (second conductivity type) opposite to the N type, the semiconductor portion being formed on a part of a one main surface side of the semiconductor substrate; a metal portion (second portion) with conductivity formed on the one main surface of the semiconductor substrate so as to be electrically connected to a part of the P type semiconductor portion; and a high resistance portion (third portion) formed so as to be electrically connected to a part of the P type semiconductor portion and to be in contact with a side surface and a bottom surface connected thereto of the P type semiconductor portion.

6 Claims, 11 Drawing Sheets

(51) Int. Cl.
- *H01L 29/66* (2006.01)
- *H01L 29/06* (2006.01)
- *H01L 21/02* (2006.01)
- *H01L 29/20* (2006.01)

(52) U.S. Cl.
CPC .. *H01L 21/02576* (2013.01); *H01L 21/02579* (2013.01); *H01L 29/0619* (2013.01); *H01L 29/47* (2013.01); *H01L 29/66143* (2013.01); *H01L 29/2003* (2013.01); *H01L 29/6606* (2013.01)

(58) Field of Classification Search
CPC ........... H01L 21/0237; H01L 21/02579; H01L 21/02576
USPC .................. 257/77, 471, 476, 484, 493, 655, 257/E21.064; 438/92, 167, 570, 572, 438/478, 762
See application file for complete search history.

(56) References Cited

FOREIGN PATENT DOCUMENTS

| | | |
|---|---|---|
| JP | 2009-277807 | 11/2009 |
| JP | 2013-074148 | 4/2013 |
| WO | WO 2014/057700 | 4/2014 |

OTHER PUBLICATIONS

Written Opinion for PCT/JP2014/079334 dated Feb. 3, 2015, 3 pages.

Treu et al., "A Surge Current Stable and Avalanche Rugged SiC Merged pn Schottky Diode Blocking 600V Especially Suited for PFC Applications", *Materials Science Forum* vols., 527-529 (2006), pp. 1155-1158.

\* cited by examiner

SEMICONDUCTOR DEVICE

This application is the U.S. national phase of International Application No. PCT/JP2014/079334 filed Nov. 5, 2014, which designated the U.S., the entire content of which is hereby incorporated by reference.

TECHNICAL FIELD

The present invention relates to a semiconductor device, and more particularly, relates to a technique for improving reverse surge withstand capability.

BACKGROUND ART

A diode such as a Schottky barrier diode (hereinafter, occasionally referred to as SBD), which is an example of a semiconductor device, is a semiconductor device that uses a rectifying action of a Schottky barrier which is a Schottky junction between a semiconductor layer and a metal layer. An SBD has characteristics such that the SBD can operate at higher speed than general PN junction diodes, and a forward voltage drop is small.

For example, in a switching power supply having such an SBD, when an emergency stop is performed in an emergency, a reverse voltage applied from the N type semiconductor layer toward the metal layer exceeds an upper limit of the breakdown voltage of the SBD (reverse breakdown voltage characteristics) in some cases. In a case where the reverse voltage exceeds the upper limit of the breakdown voltage, there is a concern that the characteristics of the SBD might be deteriorated.

FIG. 7 is a cross-sectional view showing an example of a conventional Schottky barrier diode. A Schottky barrier diode 1 shown in FIG. 7 includes a semiconductor substrate 2 that is, for example, an N type semiconductor. The semiconductor substrate 2 includes, for example, SiC (silicon carbide). In a part of the semiconductor substrate 2 on a one main surface 2a side, a guard ring 6 made of P type semiconductor is formed with a predetermined depth set in a thickness direction of the semiconductor substrate 2. Then, a metal layer 3 is formed on the one main surface 2a side of the semiconductor substrate 2, so as to be electrically-connected to a part of the guard ring 6. Additionally, a part of a bottom surface 3a of the metal layer 3 is in contact with the guard ring 6, and the other part thereof is in contact with the one main surface 2a, thus forming a Schottky junction with the semiconductor substrate 2.

The guard ring 6 includes a P+ type semiconductor portion 6a and a P− type semiconductor portion 6b which have different impurity concentrations from each other. The P− type semiconductor portion 6b is formed so as to cover side surfaces and a bottom surface of the P+ type semiconductor portion 6a. Additionally, a part of an exposed portion of the P+ type semiconductor portion 6a on the one main surface 2a of the semiconductor substrate 2, and a part of an exposed portion of the P− type semiconductor portion 6b on the one main surface 2a of the semiconductor substrate 2, are respectively in contact with parts of the bottom surface 3a of the metal layer 3.

This can improve the reverse breakdown voltage characteristics of the junction portion between the metal layer 3 and the semiconductor substrate 2.

Here, as a configuration different from that of the diode shown in FIG. 7, there is, for example, a Schottky barrier diode shown in Non-Patent Document 1. This Non-Patent Document 1 contains a description regarding the improvement of the reverse surge withstand capability.

CITATION LIST

Non-Patent Document

[Non-Patent Document 1] Material Science Forum Vols. 527-529 (2006), pp 1155-1158

DISCLOSURE OF THE INVENTION

Problems to be Solved by the Invention

However, it can be considered to improve the reverse surge withstand capability by a configuration different from that disclosed in the Non-Patent Document 1.

The present invention has an object to improve, by a configuration different than the above-described technique, the reverse surge withstand capability of a Schottky junction portion in a semiconductor device such as a Schottky barrier diode.

Means for Solving the Problems

In order to solve the above problems, a semiconductor device according to one aspect of the present invention includes at least: a semiconductor substrate of a first conductivity type; a first portion of a second conductivity type opposite to the first conductivity type, the first portion being formed on a part of a one main surface side of the semiconductor substrate; and a second portion with conductivity forming a Schottky junction with the one main surface side of the semiconductor substrate so as to be electrically connected to a part of the first portion. The first portion includes a first concentration portion and a second concentration portion which have different impurity concentrations from each other. The first concentration portion and the second concentration portion are formed on a part of the one main surface of the semiconductor substrate, and a side surface of the first concentration portion is in contact with a side surface of the second concentration portion. The semiconductor device further includes a third portion formed so as to be electrically connected to a part of the second portion, the third portion being formed so as to be in contact with a side surface and a bottom surface connected thereto of the first portion. The third portion is an intrinsic portion greater in electrical resistance value than the first portion.

In the above-described semiconductor device according to one aspect of the present invention, for example, an entire side surface of one of the first concentration portion and the second concentration portion may be in contact with a part of the side surface of the other one of the first concentration portion and the second concentration portion.

In the above-described semiconductor device according to one aspect of the present invention, for example, the semiconductor substrate may be an N type semiconductor, the first concentration portion may be a P+ type semiconductor, the second concentration portion may be a P− type semiconductor, and the third portion may be any one of a P− type semiconductor, an N− type semiconductor, and an I type semiconductor.

Additionally, a semiconductor device according to one aspect of the present invention includes at least: a semiconductor substrate of a first conductivity type; a first portion of a second conductivity type opposite to the first conductivity type, the first portion being formed on a part of a one main surface side of the semiconductor substrate; and a second portion with conductivity forming a Schottky junction with the one main surface side of the semiconductor substrate so as to be electrically connected to a part of the first portion. The first portion includes a first concentration portion and a second concentration portion which have different impurity concentrations from each other. The first concentration portion and the second concentration portion are formed on a part of the one main surface of the semiconductor substrate, and a side surface of the first concentration portion is in contact with a side surface of the second concentration portion. The semiconductor device further includes a third portion formed so as to be electrically connected to a part of the second portion, the third portion being formed so as to be in contact with a side surface and a bottom surface connected thereto of the first portion. The third portion is of the first conductivity type or the second conductivity type, and the third portion being lower in impurity concentration than the semiconductor substrate or the first portion.

In the above-described semiconductor device according to one aspect of the present invention, for example, the semiconductor substrate may be of an N type semiconductor, and the third portion may be lower in impurity concentration than the semiconductor substrate.

Further, a semiconductor device according to one aspect of the present invention includes at least: a semiconductor substrate of a first conductivity type; a first portion of a second conductivity type opposite to the first conductivity type, the first portion being formed on a part of a one main surface side of the semiconductor substrate; and a second portion with conductivity forming a Schottky junction with the one main surface side of the semiconductor substrate so as to be electrically connected to a part of the first portion. The semiconductor substrate is made of silicon carbide. The semiconductor device further includes a third portion formed so as to be electrically connected to a part of the second portion, the third portion being formed so as to be in contact with a side surface and a bottom surface connected thereto of the first portion. The third portion is of the first conductivity type or the second conductivity type, and the third portion having an impurity concentration whose range is larger than 0, and less than or equal to $1 \times 10^{14}$ cm$^{-3}$.

Effects of the Invention

According to the semiconductor device of the present invention, a third portion including an intrinsic portion greater in electrical resistance value than the first portion is formed so as to be in contact with the side surface and the bottom surface connected thereto of the first portion. This enables the Schottky junction portion of the semiconductor substrate to be lower in electric resistance value than the third portion of the semiconductor substrate. Therefore, it is possible to reliably flow the surge current toward the Schottky junction portion that is smaller in electrical resistance value. As a result, it is possible to improve the inverse surge resistance of the semiconductor device.

Additionally, according to the semiconductor device of the present invention, the third portion is formed so as to be electrically connected to a part of the second portion while being in contact with the side surface and the bottom surface connected thereto of the first portion, and the third portion is set lower in impurity concentration than the semiconductor substrate or the first portion. This enables the Schottky junction portion of the semiconductor substrate to be lower in electric resistance value than the third portion of the semiconductor substrate. Therefore, it is possible to reliably flow the surge current toward the Schottky junction portion that is smaller in electrical resistance value. As a result, it is possible to improve the inverse surge resistance of the semiconductor device.

Further, according to the semiconductor device of the present invention, a third portion formed so as to be electrically connected to a part of the second portion while being formed so as to be in contact with a side surface and a bottom surface connected thereto of the first portion, the conductivity type of the third portion is set to be the first conductivity type or the second conductivity type, and the impurity concentration of the third portion is set to be larger than 0, and less than or equal to $1 \times 10^{14}$ cm$^{-3}$. This enables the Schottky junction portion of the semiconductor substrate to be lower in electric resistance value than the third portion of the semiconductor substrate. Therefore, it is possible to reliably flow the surge current toward the Schottky junction portion that is smaller in electrical resistance value. As a result, it is possible to improve the inverse surge resistance of the semiconductor device.

MODE FOR CARRYING OUT THE INVENTION

Figure 1:
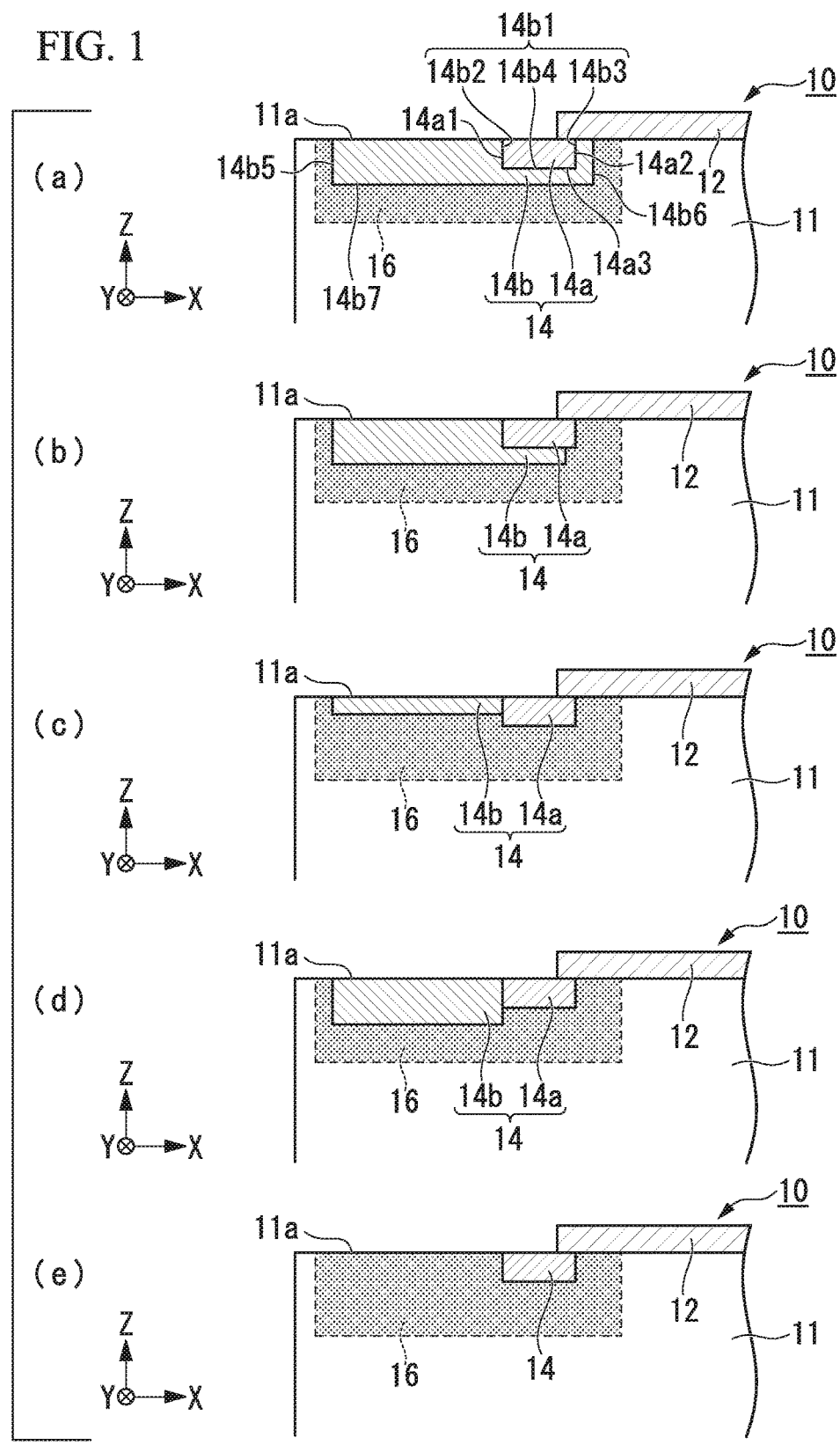
FIG. 1 is an enlarged cross-sectional view of a first embodiment and its modified examples of a principal portion of a Schottky barrier diode that is an example of a semiconductor device according to the present invention.

Referring now to the drawings, examples of the present invention will be described as specific examples of embodiments of the present invention. The present invention is not limited to the following examples.

Additionally, it should be noted that the drawings are schematic in the following description using the drawings, and proportions and the like of respective dimensions are different from those of the actual dimensions, and illustration of members other than those necessary to explain for better understanding are omitted as appropriate. Here, in order to facilitate understanding of the following description, in the drawings, a Z-axis direction represents a cross-sectional thickness direction of the diode, and X-axis and Y-axis directions represent a planar direction perpendicular to the Z-axis direction.

First of all, an outline of an overall configuration of a Schottky barrier diode, taken as an example of a semiconductor device described in the present embodiment, will be described. In the Schottky barrier diode, a metal layer (barrier metal) is formed on a one main surface of a semiconductor substrate made of, for example, N− type semiconductor substrate. This metal layer forms a Schottky junction with the semiconductor substrate. A guard ring is provided on the one main surface side, in a periphery region, of the semiconductor substrate so as to annularly surround a periphery portion of the metal layer.

Hereinafter, a semiconductor device having an internal structure of the guard ring, which is a feature of the present invention, will be described in detail with reference to the accompanying drawings.

The Schottky barrier diode, taken as an example of the semiconductor device of the present invention described below, is described while taking as an example a configuration in the periphery region of the Schottky barrier diode including a guard ring (p-type RESURF layer), which is a part of the entire configuration of the above-described Schottky barrier diode. Therefore, a configuration on the center side with respect to these periphery regions is not particularly limited.

Hereinafter, an intrinsic (intrinsic) portion represents a semiconductor region containing no dopant (impurity) at all, or having a dopant concentration that is lower by one order of magnitude or more than that of the P− type semiconductor and the N− type semiconductor. Examples of the intrinsic portion include P− type semiconductor, N− type semiconductor, and I type semiconductor (intrinsic semiconductor). These intrinsic portions have impurity concentration, specifically as a range of approximately 0 to $1\times10^{15}$ cm$^{-3}$. On the other hand, P− type semiconductor and N− type semiconductor have impurity concentration, specifically as a range of approximately $1\times10^{16}$ cm$^{-3}$ or more. Due to these differences in impurity concentration, the intrinsic portions (P− type semiconductor, N− type semiconductor, and I type semiconductor) have electrical resistance values that are higher by 10 times or more than those of the P− type semiconductor and N− type semiconductor.

(1) First Embodiment of Schottky Junction Portion

FIG. 1(a) is a cross-sectional view taken along the Z-axis direction showing an embodiment of a principal portion of a periphery region of the Schottky barrier diode which is an example of the semiconductor device according to the present invention.

A Schottky barrier diode (semiconductor device) 10 according to the present embodiment includes at least: a semiconductor substrate 11 that is of an N type (first conductivity type); a P type semiconductor portion (first portion) 14 which is of P type conductivity (second conductivity type) opposite to the N type and which is formed on a part, on a one main surface 11a side, of the semiconductor substrate 11; a conductive metal portion (second portion) 12 formed on the one main surface 11a side of the semiconductor substrate 11, so as to be electrically connected to a part of the P type semiconductor portion 14; and a high resistance portion (third portion) 16 formed so as to be in contact with a side surface and a bottom surface connected thereto of the P type semiconductor portion 14 while being electrically-connected to a part of a bottom surface of the metal portion 12 on the one main surface 11a side of the semiconductor substrate 11. The high resistance portion 16 is formed so as to be in contact with side surfaces and a bottom surface connected thereto, excluding the one main surface 11a side of the semiconductor substrate 11, of the P type semiconductor portion 14.

The P type semiconductor portion 14 includes a P+ type semiconductor portion (first concentration portion) 14a and a P− type semiconductor portion (second concentration portion) 14b, which have impurity concentrations different from each other. A part of the P+ type semiconductor portion 14a on the one main surface 11a side of the semiconductor substrate 11 is in contact with the metal portion 12. The P− type semiconductor portion 14b is in contact with both side surfaces of the P+ type semiconductor portion 14a. Further, the P− type semiconductor portion 14b is in contact with a bottom surface, connected to the both side surfaces, of the P+ type semiconductor portion 14a. Additionally, a part of the P− type semiconductor portion 14b on the one main surface 11a side of the semiconductor substrate 11 is in contact with the metal portion 12.

In a part of the P− type semiconductor portion 14b, a recessed portion 14b1 is formed extending from the one main surface 11a of the semiconductor substrate 11 to a predetermined depth. Then, the P+ type semiconductor portion 14a is formed so as to fill the recessed portion 14b1. The P+ type semiconductor portion 14a has a one side surface 14a1 in contact with a one side surface 14b2 of the recessed portion 14b1 of the P− type semiconductor portion 14b. Additionally, the other side surface 14a2 of the P+ type semiconductor portion 14a is in contact with the other side surface 14b3 of the recessed portion 14b1 of the P− type semiconductor portion 14b. Further, a bottom surface 14a3 of the P+ type semiconductor portion 14a is in contact with a bottom surface 14b4 of the recessed portion 14b1 of the P− type semiconductor portion 14b.

Here, description will be given in the present specification with respect to a case where the side surface 14a1 and the side surface 14b2 which are in contact with the P+ type semiconductor portion 14a and the P− type semiconductor portion 14b extend vertically, as in the illustrated example. However, the side surfaces are not limited to those vertically extending, and may be, for example, inclined surfaces, curved surfaces, or the like, as long as at least the P+ type semiconductor portion 14a and the P− type semiconductor portion 14b are in contact with each other in the lateral direction. In this case, it is preferable that the bottom surface is in a region close to bottom surfaces of these inclined surfaces and curved surfaces.

Additionally, these P+ type semiconductor portion 14a and the P− type semiconductor portion 14b are formed generally by doping impurities from the one main surface 11a side of the semiconductor substrate 11. Therefore, a clear interface is not necessarily formed between the recessed portion 14b1 of the P− type semiconductor portion 14b and the P+ type semiconductor portion 14a. Although the interface between the P+ type semiconductor portion 14a and the P− type semiconductor portion 14b is represented by a solid line in the section view of FIG. 1(a), the solid line is conveniently drawn in order to clarify the structure of each portion. For this reason, in practice, the regions having impurity concentrations different from each other are spread without a distinct interface. The actual states of these regions having impurity concentrations different from each other are similar in later-described modified examples or embodiments, and even if a line is illustrated in the drawings so as to define respective portions, an actually distinct interface does not necessarily exist.

The high resistance portion 16 is formed so as to be in contact with both side surfaces 14b5 and 14b6, and the bottom surface 14b7 connected thereto, excluding the one main surface 11a side of the semiconductor substrate 11, of the P− type semiconductor portion 14b. Additionally, a part of the high-resistance portion 16 on the one main surface 11a side of the semiconductor substrate 11 is in contact with a part of the bottom surface 12a of the metal portion 12. The P type semiconductor portion 14 is formed so that the bottom surface thereof is located at a predetermined depth from the one main surface 11a of the semiconductor substrate 11. Then, the high resistance portion 16 is formed so that the bottom surface thereof is located at a position deeper in the thickness direction (Z-axis direction) of the semiconductor substrate 11 than the bottom surface of p type semiconductor portion 14.

In the present embodiment, the high resistance portion 16 is formed of a P− type semiconductor, which is an example of an intrinsic portion formed lower in impurity concentration than the P− type semiconductor forming the P− type semiconductor portion 14b. The high resistance portion 16 has an impurity concentration whose range is less than $1\times10^{15}$ cm$^{-3}$. On the other hand, the P+ type semiconductor portion 14a and the P− type semiconductor unit 14b, which are adjacent to the high resistance portion 16, have impurity concentrations whose ranges are higher than, for example, a $1\times10^{16}$ cm$^{-3}$. The difference among such impurity concentrations enables an electric resistance value of the high resistance portion 16 to be, for example, at least 10 times greater than the electric resistance value of the P+ type semiconductor portion 14a and the P− type semiconductor portion 14b.

By such configuration, it is possible to make the electric resistance value of the semiconductor substrate 11 at the Schottky junction portion with the metal portion 12 smaller than the electric resistance value of the semiconductor substrate 11 at the portion of the high resistance portion (third portion) 16.

As the semiconductor substrate 11, a SiC (silicon carbide) substrate or a Si (silicon) substrate can be used. In particular, as compared with a Schottky barrier diode configured using the Si substrate, a Schottky barrier diode formed using a SiC substrate has a very short reverse recovery time, enables fast switching, and can reduce a switching loss because of the short reverse recovery. Additionally, the reverse recovery time of the Schottky barrier diode formed using the Si substrate becomes longer as the temperature increases. On the other hand, the reverse recovery time of the Schottky barrier diode configured using the SiC substrate is almost constant independently of the temperature, and thus the switching loss is not increased even during high temperature operation. Therefore, the semiconductor substrate 11 is more useful in the case of using the SiC substrate, as compared with the case of using the Si substrate.

Here, it has been described in the present embodiment with respect to the case where the semiconductor substrate 11 which is an N type semiconductor and the metal portion 12 form the Schottky junction. However, a configuration may be such that, for example, an N− type semiconductor containing an impurity at a low concentration is stacked by epitaxial growth or the like on the one main surface 11a side of the semiconductor substrate 11, and the N− type semiconductor and the metal portion 12 form the Schottky junction.

As a material constituting the metal portion 12, for example, Al (aluminum), Mo (molybdenum), Ti (titanium), and the like, are known. These single metals, or an alloy containing at least one of these metals, form the metal portion 12.

According to the Schottky barrier diode 10 shown in FIG. 1, the both side surfaces and the bottom surface connected thereto of the P− type semiconductor portion 14b constituting the P type semiconductor portion 14 are covered by the high resistance portion 16 that is larger in electric resistance value than the P− type semiconductor portion 14b. Thereby, it is possible to make the Schottky junction portion between the metal portion 12 and the semiconductor substrate 11 smaller in electric resistance value than the contacting portion between the metal portion 12 and the P type semiconductor portion 14.

In the conventional Schottky barrier diode, when a depletion layer completely expands from the Schottky junction portion between the semiconductor substrate and the metal layer, the electric field concentration on the periphery region of the Schottky barrier diode is not relaxed, thereby decreasing the reverse surge withstand capability.

However, according to the Schottky barrier diode 10 of the present invention having the above-described structure, both the side surfaces and the bottom surface connected thereto, excluding the one main surface 11a side of the semiconductor substrate 11, of the P type semiconductor portion 14 are covered by the high resistance portion 16, thereby making it possible to make the Schottky junction portion between the metal portion 12 and the semiconductor substrate 11 smaller in electric resistance value than the contacting portion between the metal portion 12 and the P type semiconductor portion 14 and the contacting portion between the metal portion 12 and the high resistance portion 16. For this reason, the surge current flows toward the Schottky junction portion with the smaller electric resistance value. As a result, it is possible to improve the reverse surge resistance of the Schottky barrier diode 10. In a case where such a Schottky barrier diode 10 of the present invention is applied to, for example, a switching power supply, even if an excessive reverse voltage is generated by an emergency stop or the like in an emergency, it is possible to avoid the functional deterioration of the Schottky barrier diode 10.

(2) Modified Example of First Embodiment of Schottky Junction Portion

Modified examples of the above-described Schottky barrier diode of the first embodiment are shown in FIGS. 1(b) to 1(e). Here, the same reference numerals are appended to configurations similar to those of the first embodiment shown in FIG. 1(a), and a description thereof will be omitted.

In a Schottky barrier diode 10 shown in FIG. 1(b), a part of the bottom surface of the metal portion 12 is in contact with a part of the P+ type semiconductor portion 14a on the one main surface 11a side of the semiconductor substrate 11. Then, the P− type semiconductor portion 14b is configured to cover from the side surface, on the peripheral edge side, of the semiconductor substrate 11 to a part of the bottom surface of the P+ type semiconductor portion 14a, and to be not in contact with the metal portion 12. Then, the high resistance portion 16 is configured to cover a one side surface and a part of the bottom surface connected thereto of the P+ type semiconductor portion 14a, and also cover a part of a one side surface, the entire bottom surface connected thereto, and the entire other side surface, of the P− type semiconductor portion 14b. When such a configuration is employed, a volume of the P− type semiconductor portion 14b becomes smaller than in the configuration shown in FIG. 1(a). Thereby, it is possible to narrow a range of damages caused by implantation of dopant for forming the P− type semiconductor portion 14b, and to suppress occurrence of disturbance or the like of the crystal structure.

In a Schottky barrier diode 10 shown in FIG. 1(c), a part of the bottom surface of the metal portion 12 is in contact with a part of the P+ type semiconductor portion 14a on the one main surface 11a side of the semiconductor substrate 11. Additionally, the P− type semiconductor portion 14b is formed so as to be in contact with a part of the side surface of the P+ type semiconductor portion 14a on the one main surface 11a side of the semiconductor substrate 11. The P− type semiconductor portion 14b is formed closer to the peripheral edge side of the semiconductor substrate 11 than the P+ type semiconductor portion 14a, and is configured to be not in contact with the bottom surfaces of the metal portion 12 and the P+ type semiconductor portion 14a. Additionally, the P− type semiconductor portion 14b is formed so as to be thinner in thickness than the P+ type semiconductor portion 14a. The high resistance portion 16 is configured to cover the entire one side surface, the entire bottom surface connected thereto, and a part of the other side surface connected thereto, of the P+ type semiconductor portion 14a, and also cover the entire bottom surface and the entire other side surface of the P− type semiconductor portion 14b. Thus, when the P− type semiconductor portion 14b is formed so as to be thinner in thickness than the P+ type semiconductor portion 14a, it is possible to narrow a range, in the depth direction, of damages caused by implantation of dopant for forming the P− type semiconductor portion 14b and also suppress the occurrence of disturbance or the like of the crystal structure.

In a Schottky barrier diode 10 shown in FIG. 1(d), a part of the bottom surface of the metal portion 12 is in contact with a part of the P+ type semiconductor portion 14a on the one main surface 11a side of the semiconductor substrate 11. Additionally, the P− type semiconductor portion 14b is formed so as to be in contact with the entire other side surface of the P+ type semiconductor portion 14a on the one main surface 11a side of the semiconductor substrate 11. The P− type semiconductor portion 14b is formed closer to the peripheral edge side of the semiconductor substrate 11 than the P+ type semiconductor portion 14a, and is configured to be not in contact with the bottom surfaces of the metal portion 12 and the P+ type semiconductor portion 14a. Additionally, the P− type semiconductor portion 14b is formed so as to be thicker in thickness than the P+ type semiconductor portion 14a. The high resistance portion 16 is configured to cover the entire one side surface and the entire bottom surface connected to thereto of the P+ type semiconductor portion 14a, and also cover a part of one side surface, the entire bottom surface connected thereto, and the entire other side surface of the P− type semiconductor portion 14b. Thus, when the P− type semiconductor portion 14b is formed so as to be thicker in thickness than the P+ type semiconductor section 14a, even when such a step of reducing the thickness of the semiconductor substrate 11 on the one main surface 11a side in order to flatten the one main surface 11a side of the semiconductor substrate 11, it is possible to keep the P− type semiconductor portion 14b thicker in thickness than the P+ type semiconductor portion 14a, thereby making it possible to prevent the P− type semiconductor portion 14b from being thinned more than necessary, thus causing an increase in leakage current. Additionally, when the P− type semiconductor portion 14b is formed so as to be thicker in thickness than the P+ type semiconductor unit 14a, it is possible to further reduce the leakage current in the periphery region of the semiconductor substrate 11.

In a Schottky barrier diode 10 shown in FIG. 1(e), the semiconductor substrate 11 is formed of SiC. Then, the P type semiconductor portion 14 is formed on a part of the one main surface 11a side of the semiconductor substrate 11. Additionally, a part of the bottom surface of the metal portion 12 is in contact with a part of the P+ type semiconductor portion 14 on the one main surface 11a side of the semiconductor substrate 11. This P type semiconductor portion 14 is formed so as to be not in contact with the periphery of the semiconductor substrate 11. Then, the high resistance portion 16 covers the entire both side surfaces and the entire bottom surface connected thereto, excluding the one main surface 11a side of the semiconductor substrate 11, of the P type semiconductor portion 14. The high resistance portion 16 is formed so that the impurity concentration is greater than 0, and less than or equal to $1 \times 10^{14}$ cm$^{-3}$.

In the present embodiment, the P type semiconductor portion 14 is constituted by one portion without being divided into a P− type semiconductor, a P+ type semiconductor, and the like. It is preferable that the impurity concentration of the P type semiconductor portion 14 of the present embodiment is the same as that of, for example, the P− type semiconductor. In such an embodiment, the P type semiconductor portion 14 is constituted by one portion, instead of a plurality of portions with different impurity concentrations, thereby making it possible to simplify the manufacturing process. Additionally, the area to be implanted with dopant also becomes smaller, thereby making it possible to suppress the occurrence of disturbance or the like of the crystal structure.

(3) Second Embodiment of Schottky Junction Portion

Next, a Schottky barrier diode according to the second embodiment will be described. Here, the same reference numerals are appended to the same components as those of the aforementioned Schottky barrier diode according to the first embodiment, and detailed description thereof will be omitted.

FIG. 2(a) is a fragmentary cross-sectional view of the periphery region of the Schottky barrier diode according to the present invention.

In the above-described first embodiment, the P− type semiconductor is used as the high resistance portion 16. In the Schottky barrier diode 20 according to the following second embodiment, however, an N− type semiconductor is as a high resistance portion 17.

A Schottky barrier diode 20 according to the second embodiment includes at least an N type semiconductor substrate 11, a P type semiconductor portion 14 which is of a P type opposite to the N type and is formed on a part of the main surface 11a side of the semiconductor substrate 11, a conductive metal portion 12 formed on the one main surface 11a side of the semiconductor substrate 11 so as to be electrically connected to a part of the P type semiconductor portion 14, and a high resistance portion 17 formed so as to be in contact with the side surfaces and the bottom surface connected thereto of the P type semiconductor portion 14 while being electrically connected to a part of the bottom surface of the metal portion 12 on the main surface 11a side of the semiconductor substrate 11. The high resistance portion 17 is formed so as to be in contact with both side surfaces and the bottom surface connected thereto, excluding the one main surface 11a side of the semiconductor substrate 11, of the P type semiconductor portion 14.

The P type semiconductor portion 14 includes the P+ type semiconductor portion 14a and the P− type semiconductor portion 14b, which have different impurity concentrations from each other. A part of the P+ type semiconductor portion 14a on the one main surface 11a side of the semiconductor substrate 11 is in contact with the metal portion 12. The P− type semiconductor portion 14b is formed so as to be in contact with both side surfaces and a bottom surface connected thereto, excluding the main surface 11a side of the semiconductor substrate 11, of the P+ type semiconductor portion 14a. Additionally, a part of the P− type semiconductor portion 14b on the one main surface 11a side of the semiconductor substrate 11 is in contact with the metal portion 12.

The high resistance portion 17 is formed so as to be in contact with both side surfaces and a bottom surface connected thereto, excluding the one main surface 11a side of the semiconductor substrate 11, of the P− type semiconductor portion 14b. Additionally, a part of the high resistance portion 17 on the one main surface 11a side of the semiconductor substrate 11 is in contact with a part of the bottom surface of the metal portion 12. The P type semiconductor portion 14 is formed so that a bottom surface thereof is located at a predetermined depth from the one main surface 11a of the semiconductor substrate 11. Then, the bottom surface of the high resistance portion 17 is formed at a position deeper in the thickness direction (Z-axis direction) of the semiconductor substrate 11 than the bottom surface of the P type semiconductor portion 14.

In the present embodiment, the high resistance portion 17 includes a P− type semiconductor, which is an example of an intrinsic portion formed lower in impurity concentration than the P− type semiconductor forming the P− type semiconductor portion 14b. The high resistance portion 17 has impurity concentration whose range is less than $1 \times 10^{15}$ $cm^{-3}$. On the other hand, the P+ type semiconductor portion 14a and the P− type semiconductor unit 14b, which are adjacent to the high resistance portion 17, have impurity concentrations whose ranges are greater than, for example, $1 \times 10^{16}$ $cm^{-3}$. The difference among the impurity concentrations makes it possible to make an electric resistance value of the high resistance portion 17, for example, at least 10 times larger than the electric resistance values of the P+ type semiconductor portion 14a and the P− type semiconductor portion 14b.

Here, the description has been given in the present embodiment with respect to the case where the semiconductor substrate 11 which is an N-type semiconductor and the metal portion 12 form the Schottky junction. However, a configuration may be such that, for example, an N− type semiconductor containing impurity at a low concentration is stacked by epitaxial growth or the like on the one main surface 11a side of the semiconductor substrate 11, and the N− type semiconductor and the metal portion 12 form the Schottky junction.

As a material constituting the metal portion 12, for example, Al (aluminum), Mo (molybdenum), Ti (titanium), and the like, are known. These single metals, or an alloy containing at least one of these metals, form the metal portion 12.

Figure 2:
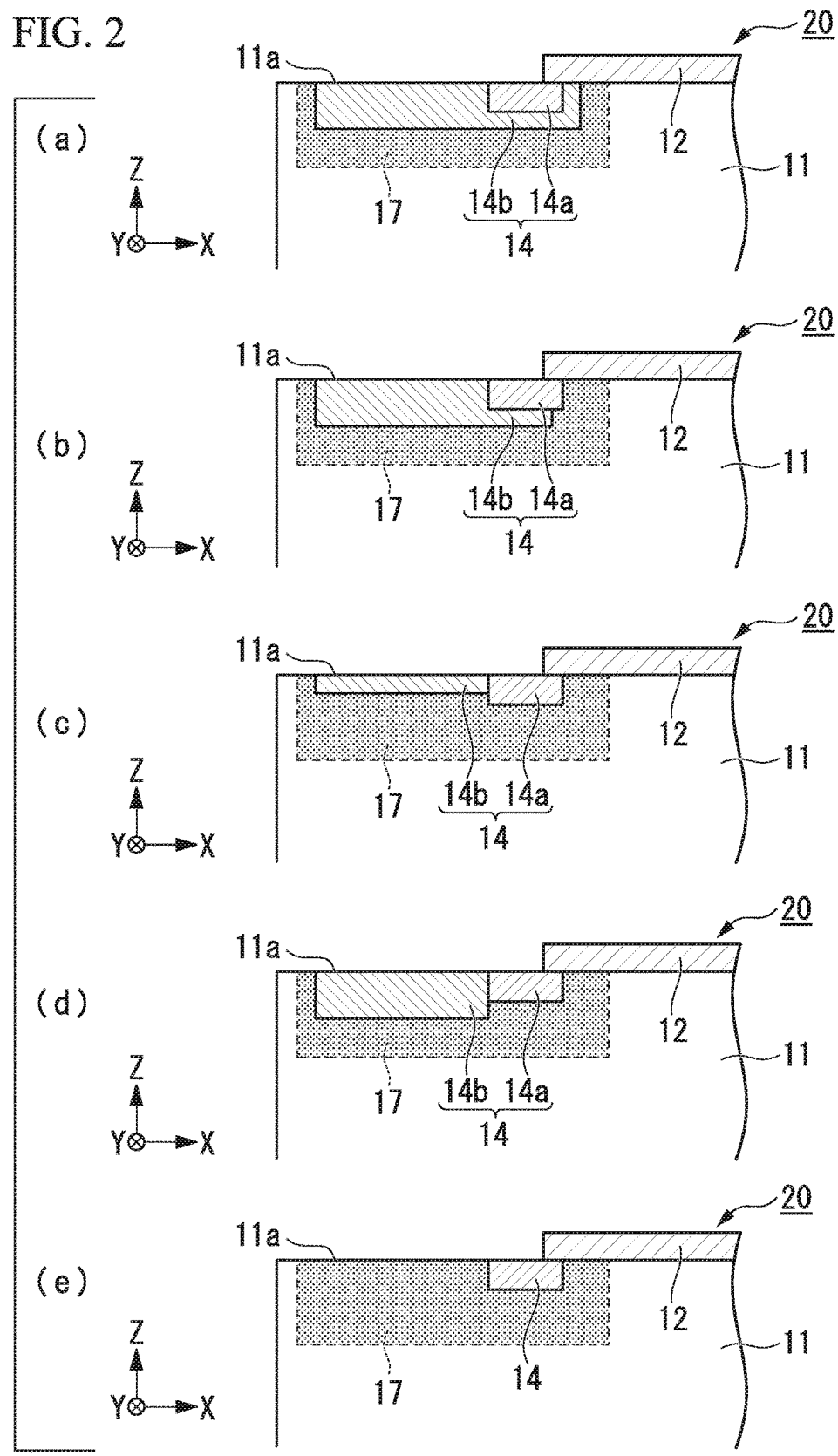
FIG. 2 is an enlarged cross-sectional view of a second embodiment and its modified examples of the principal portion of the Schottky barrier diode according to the present invention.

According to the Schottky barrier diode 20 shown in FIG. 2, the both side surfaces and the bottom surface connected thereto of the P− type semiconductor portion 14b constituting the P type semiconductor portion 14 is covered by the high resistance portion 17 that is larger in electric resistance value than the N− type semiconductor constituting the semiconductor substrate 11. Thereby, it is possible to make the Schottky junction portion between the metal portion 12 and the semiconductor substrate 11 smaller in electric resistance value than the contacting portion between the metal portion 12 and the P type semiconductor portion 14. For this reason, the surge current flows toward the Schottky junction portion with the smaller electric resistance value. As a result, it is possible to improve the reverse surge resistance of the Schottky barrier diode 10.

(2) Modified Example of Second Embodiment of Schottky Junction Portion

Modified examples of the above-described Schottky barrier diode of the second embodiment are shown in FIGS. 2(b) to 2(e). Here, the same reference numerals are appended to configurations similar to those of the second embodiment shown in FIG. 2(a), and a description thereof will be omitted.

In a Schottky barrier diode 20 shown in FIG. 2(b), a part of the bottom surface of the metal portion 12 is in contact with a part of the P+ type semiconductor portion 14a on the one main surface 11a side of the semiconductor substrate 11. Then, the P− type semiconductor portion 14b is configured to cover from a side surface on the periphery side of the semiconductor substrate 11 to a part of the bottom surface of the P+ type semiconductor portion 14a, and to be not in contact with the metal portion 12. Further, the high resistance portion 17 is configured to cover a one side surface and a part of the bottom surface connected thereto of the P+ type semiconductor portion 14a, and also cover a part of a one side surface, the entire bottom surface connected thereto, and the entire other side surface of the P− type semiconductor portion 14b. When such a configuration is employed, a volume of the P− type semiconductor portion 14b becomes smaller than in the configuration shown in FIG. 2(a). Thereby, it is possible to narrow a range of damages caused by implantation of dopant for forming the P− type semiconductor portion 14b, and suppress occurrence of disturbance or the like of the crystal structure.

In a Schottky barrier diode 20 shown in FIG. 2(c), a part of the bottom surface of the metal portion 12 is in contact with a part of the P+ type semiconductor portion 14a on the one main surface 11a side of the semiconductor substrate 11. Additionally, the P− type semiconductor portion 14b is formed so as to be in contact with a part of the side surface of the P+ type semiconductor portion 14a on the one main surface 11a side of the semiconductor substrate 11. The P− type semiconductor portion 14b is formed closer to the periphery side of the semiconductor substrate 11 than the P+ type semiconductor portion 14a, and is configured to be not in contact with the bottom surfaces of the metal portion 12 and the P+ type semiconductor portion 14a. Additionally, the P− type semiconductor portion 14b is formed so as to be thinner in thickness than the P+ type semiconductor portion 14a. The high resistance portion 17 is configured to cover the entire one side surface, the entire bottom surface connected thereto, and a part of the other side surface connected thereto, of the P+ type semiconductor portion 14a, and also cover the entire bottom surface and the entire other side surface of the P− type semiconductor portion 14b. Thus, when the P− type semiconductor portion 14b is formed so as to be thinner in thickness than the P+ type semiconductor portion 14a, it is possible to narrow a range, in the depth direction, of damages caused by implantation of dopant for forming the P− type semiconductor portion 14b and also suppress the occurrence of disturbance or the like of the crystal structure.

In a Schottky barrier diode 20 shown in FIG. 2(d), a part of the bottom surface of the metal portion 12 is in contact with a part of the P+ type semiconductor portion 14a on the one main surface 11a side of the semiconductor substrate 11. Additionally, the P− type semiconductor portion 14b is formed in contact with the entire other side surface of the P+ type semiconductor portion 14a on the one main surface 11a side of the semiconductor substrate 11. The P− type semiconductor portion 14b is formed closer to the periphery side of the semiconductor substrate 11 than the P+ type semiconductor portion 14a, and is configured to be not in contact with the bottom surfaces of the metal portion 12 and the P+ type semiconductor portion 14a. Further, the P− type semiconductor portion 14b is formed so as to be thicker in thickness than the P+ type semiconductor portion 14a. The high resistance portion 17 is configured to cover the entire one side surface and the entire bottom surface connected thereto of the P+ type semiconductor portion 14a, and also cover a part of a one side surface, the entire bottom surface connected thereto, and the entire other side surface of the P− type semiconductor portion 14b. Thus, when the P− type semiconductor portion 14b is formed so as to be thicker in thickness than the P+ type semiconductor section 14a, even when such a step of reducing the thickness of the semiconductor substrate 11 on the one main surface 11a side is performed in order to flatten the one main surface 11a side of the semiconductor substrate 11, it is possible to keep the P− type semiconductor portion 14b thicker in thickness than the P+ type semiconductor portion 14a, thereby making it possible to prevent the P− type semiconductor portion 14b from being thinned more than necessary, thus causing an increase in leakage current. Additionally, when the P− type semiconductor portion 14b is formed so as to be thicker in thickness than the P+ type semiconductor unit 14a, it is possible to further reduce the leakage current in the periphery region of the semiconductor substrate 11.

In a Schottky barrier diode 20 shown in FIG. 2(e), the semiconductor substrate 11 is formed of SiC. Then, the P type semiconductor portion 14 is formed on a part of the one main surface 11a side of the semiconductor substrate 11. Additionally, a part of the bottom surface of the metal portion 12 is in contact with a part of the P type semiconductor portion 14 on the one main surface 11a side of the semiconductor substrate 11. This P type semiconductor portion 14 is formed so as to be not in contact with the periphery of the semiconductor substrate 11. Then, the high resistance portion 17 covers the entire both side surfaces and the entire bottom surface connected thereto, excluding the one main surface 11a side of the semiconductor substrate 11, of the P type semiconductor portion 14. The high resistance portion 17 is formed so that the impurity concentration is greater than 0, and less than or equal to $1 \times 10^{14}$ cm$^{-3}$.

In the present embodiment, the P type semiconductor portion 14 is constituted by one portion without being divided into a P− type semiconductor, a P+ type semiconductor, and the like. It is preferable that the impurity concentration of the P type semiconductor portion 14 of the present embodiment is the same as that of, for example, the P− type semiconductor. In such an embodiment, the P type semiconductor portion 14 is constituted by one portion, instead of a plurality of portions with different impurity concentrations, thereby making it possible to simplify the manufacturing process. Additionally, the area to be implanted with dopant also becomes smaller, thereby making it possible to suppress the occurrence of disturbance or the like of the crystal structure.

(5) Other Embodiments of Schottky Junction

Hereinafter, although several modified examples of the Schottky junction portion of the Schottky barrier diode, which is an example of the semiconductor device according to the present invention, are introduced, the present invention is not limited to these embodiments. Here, the same reference numerals are appended to the same components as those of the Schottky barrier diode according to the first embodiment, and detailed description thereof will be omitted.

Figure 8:
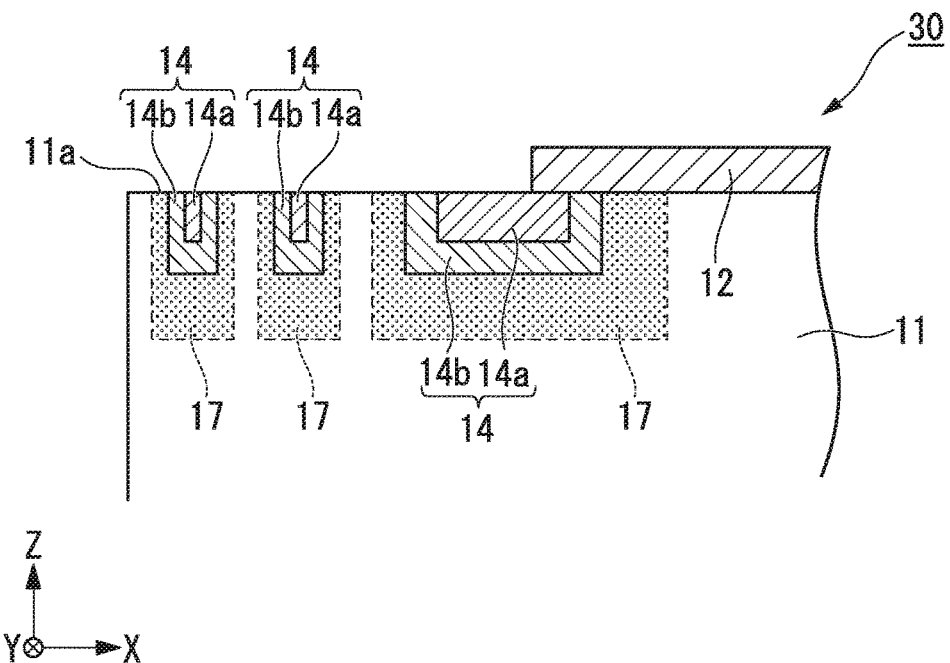
FIG. 8 is an enlarged cross-sectional view showing a principal portion of a periphery region of another embodiment of the Schottky barrier diode according to the present invention.

A Schottky barrier diode 30 shown in FIG. 8 includes at least an N type semiconductor substrate 11, a P type semiconductor portion 14 which is of a P type opposite to the N type and is formed on a part of the main surface 11a side of the semiconductor substrate 11, a conductive metal portion 12 formed on the one main surface 11a side of the semiconductor substrate 11 so as to be electrically connected to a part of the P type semiconductor portion 14, and a high resistance portion 17 formed so as to be in contact with the side surfaces and the bottom surface connected thereto of the P type semiconductor portion 14, while being electrically connected to a part of the P type semiconductor portion.

Additionally, the P type semiconductor portion 14 includes the P+ type semiconductor portion 14a and the P− type semiconductor portion 14b, which have different impurity concentrations from each other. Then, the high resistance portion 17 is formed so as to be in contact with both side surfaces and a bottom surface connected thereto, excluding the main surface 11a side of the semiconductor substrate 11, of the P+ type semiconductor portion 14b.

Then, in the present embodiment, the high resistance portion 17 includes a P− type semiconductor, which is an example of an intrinsic portion formed lower in impurity concentration than the P− type semiconductor forming the P− type semiconductor portion 14b. The high resistance portion 17 that is such an intrinsic portion has impurity concentration whose range is less than $1 \times 10^{15}$ cm$^3$. On the other hand, the P+ type semiconductor portion 14a and the P− type semiconductor unit 14b, which are adjacent thereto, have impurity concentrations whose ranges are greater than or equal to, for example, $1 \times 10^{16}$ cm$^{-3}$. The difference among such impurity concentrations makes it possible to make an electric resistance value of the high resistance portion 17, for example, at least 10 times larger than the electric resistance values of the P+ type semiconductor portion 14a and the P− type semiconductor portion 14b.

Further, in the present embodiment, a configuration is made such that a plurality of structures each including those P+ type semiconductor portion 14a, the P− type semiconductor portion 14b, and the high resistance portion 17 are separately arranged toward the periphery side of the semiconductor substrate 11. Among those structures, only the structure formed on the center side with respect to the periphery region of the semiconductor substrate 11 is configured to be in contact with the metal portion 12, and the structures formed closer to the periphery side than the structure on the center side is configured to be not in contact with the metal portion 12. Additionally, the structure closer to the periphery side is formed narrower in width than the structure in contact with the metal portion 12. Additionally, the high resistance portion 17 is formed so as to be in contact with the both side surfaces and the bottom surface connected thereto, excluding the main surface 11a side of the semiconductor substrate 11, of the P− type semiconductor portion 14b of each structure.

With respect to the relationship between the impurity concentration and the breakdown voltage of the P− type semiconductor portion 14b, as a larger number of structures each including the P− type semiconductor portion 14b and the high resistance portions 17 are arranged toward the periphery side of the semiconductor substrate 11, the range of the impurity concentration taking the highest breakdown voltage value becomes wider. For this reason, as in the present embodiment, a plurality of structures each including the P− type semiconductor portion 14b and the high resistance portions 17 are arranged toward the periphery side of the semiconductor substrate 11, thereby making it possible to maintain the high breakdown voltage even if there is a variation in in-plane distribution of the concentration of the impurity contained in the semiconductor substrate 11. On the other hand, if the number of such structures each including the P− type semiconductor portion 14b and the high resistance portion 17 is increased, the Schottky barrier diode 30 becomes larger in size. Therefore, it is preferable to set the number in accordance with the size of the semiconductor substrate 11. For example, more or less than two structures can be provided as in the present embodiment.

Figure 9:
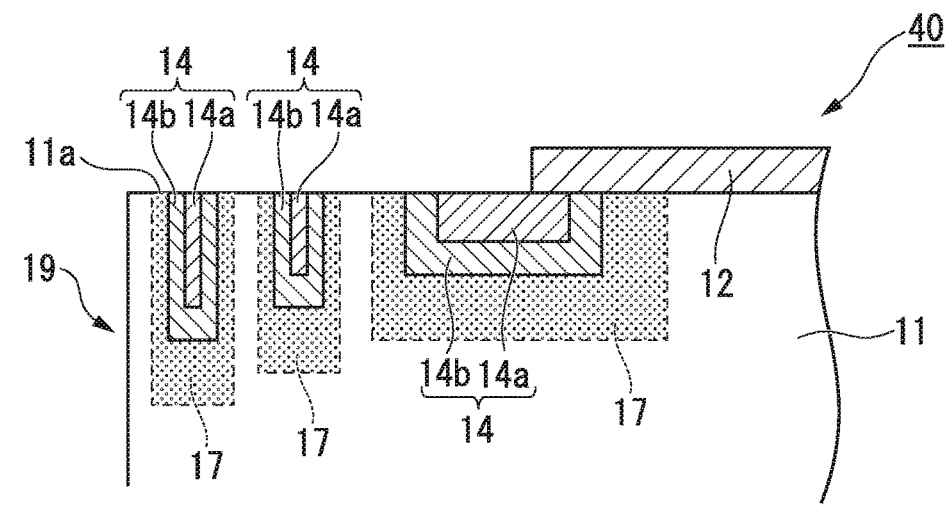
FIG. 9 is an enlarged cross-sectional view showing a principal portion of a periphery region of another embodiment of the Schottky barrier diode according to the present invention.

A configuration of a Schottky barrier diode 40 shown in FIG. 9 is the same in part as the configuration of the Schottky barrier diode 30 shown in FIG. 8. In the present embodiment, a plurality of structures each including the P+ type semiconductor portion (first concentration portion) 14a, the P− type semiconductor portion (second concentration portion) 14b, and the high resistance portion 17 are separately arranged toward the periphery side of the semiconductor substrate 11 along the X-axis direction. Further, among these structures, one closer to the periphery region of the semiconductor substrate 11 is formed with a larger depth in the thickness direction of the semiconductor substrate 11. Additionally, the high resistance portion 17 is formed so as to be in contact with the both side surfaces and the bottom surface connected thereto, excluding the one main surface 11a side of the semiconductor substrate 11, of the P− type semiconductor portion (second concentration portion) 14b of each structure.

In the present embodiment, as comparing the structures each including the P+ type semiconductor portion (first concentration portion) 14a, the P− type semiconductor portion (second concentration portion) 14b, and the high resistance portion 17 with the embodiment shown in FIG. 8, the structure closer to the periphery region of the semiconductor substrate 11 is formed with a larger depth in the thickness direction of the semiconductor substrate 11. For example, in a case where a step of implanting dopant into portions other than those of the above structures in the semiconductor substrate 11, down to the depths of the respective structures, the above structures with the respective depths may be formed in the same step, thereby making it possible to easily form the above structures without complicating the manufacturing process.

Figure 13:
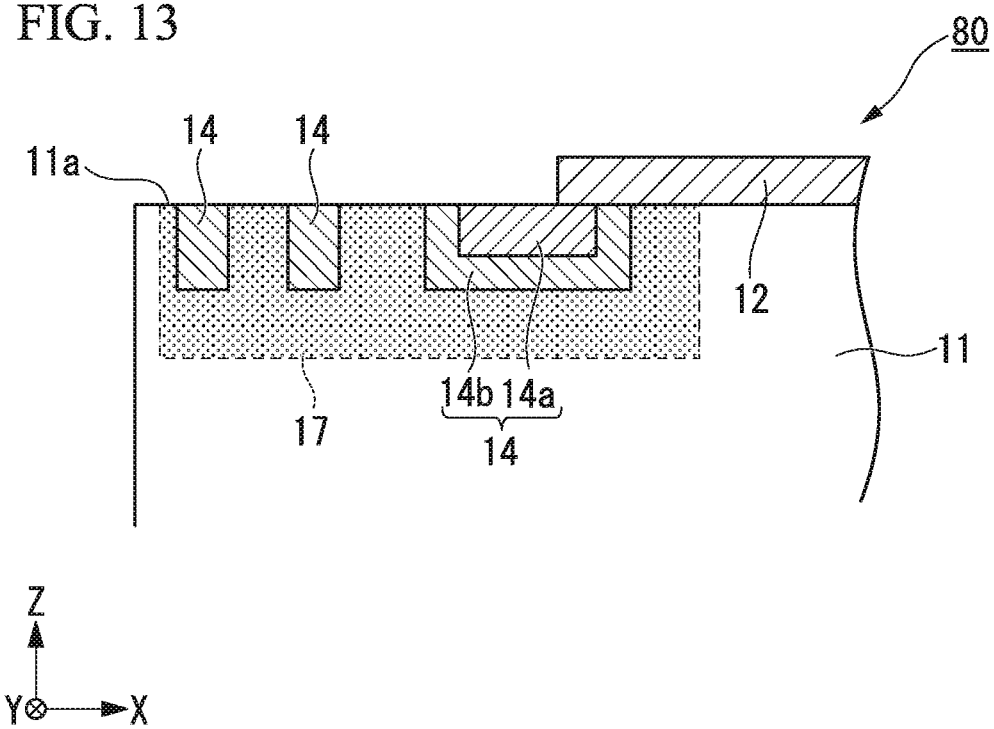
FIG. 13 is an enlarged plan view showing a principal portion of a periphery region of another embodiment of the Schottky barrier diode according to the present invention.

A configuration of a Schottky barrier diode 80 shown in FIG. 13 is the same in part as the configuration of the Schottky barrier diode 30 shown in FIG. 8. In the present embodiment, a plurality of P type semiconductor portions 14 are separately arranged toward the periphery side of the semiconductor substrate 11 along the X-axis direction, and the plurality of P type semiconductor portions 14 as well as the P+ type semiconductor portion 14a and the P− type semiconductor portion 14b are covered by the one high resistance portion 17.

In such the Schottky barrier diodes 80 shown in FIG. 13, as compared to the Schottky barrier diode 30 shown in FIG. 8, the P type semiconductor portions 14 other than the P type semiconductor portion 14 in contact with the metal portion 12 are configured by a single layer without dividing each of those P type semiconductor portions 14 into the P− type semiconductor portion and the P+ type semiconductor portion. This makes it possible to simplify the manufacturing process. Here, it is preferable that the impurity concentration of the P type semiconductor portion 14 in the present embodiment is the same as that of the P− type semiconductor portion.

Figure 10:
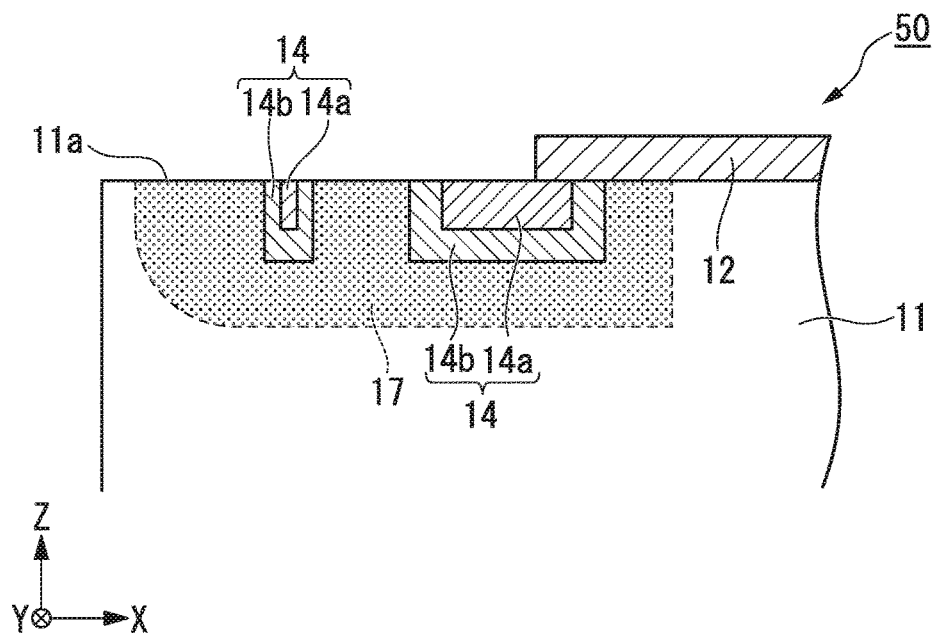
FIG. 10 is an enlarged cross-sectional view showing a principal portion of a periphery region of another embodiment of the Schottky barrier diode according to the present invention.

A Schottky barrier diode 50 shown in FIG. 10 includes an N type (first conductivity type) semiconductor substrate 11, a P type semiconductor portion (first portion) 14 which is of a P type (second conductivity type) opposite to the N type and which is formed on a part of the one main surface 11a side of the semiconductor substrate 11, and a conductive metal portion (second portion) 12 formed on the one main surface 11a side of the semiconductor substrate 11, so as to be electrically connected to a part of the P type semiconductor portion 14. Then, the high resistance portion 17 is formed in contact with the both side surfaces and the bottom surface connected thereto, excluding the one main surface 11a side of the semiconductor substrate 11, of the P type semiconductor portion 14.

Additionally, the P type semiconductor portion 14 includes a P+ type semiconductor portion (first concentration portion) 14a and a P− type semiconductor portion (second concentration portion) 14b, which have different impurity concentrations from each other. The high resistance portion 17 is formed in contact with the both side surfaces and the bottom surface connected thereto, excluding the one main surface 11a side of the semiconductor substrate 11, of the P type semiconductor portion 14 including the P+ type semiconductor portion (first concentration portion) 14a and the P− type semiconductor portion (second concentration portion) 14b.

Then, in the present embodiment, a plurality of structures each including the P+ type semiconductor portion (first concentration portion) 14a and the P− type semiconductor portion (second concentration portion) 14b are separately arranged toward the periphery side of the semiconductor substrate 11 along the X-axis direction. Among these structures, only the one formed on the center side with respect to the periphery region of the semiconductor substrate 11 is configured to be in contact with the metal portion 12, and the ones formed closer to the periphery side than the one on the center side is configured to be not in contact with the metal portion 12. Additionally, the ones formed closer to the periphery side than the one in contact with the metal portion 12 is formed narrower in width than the one in contact with the metal portion 12.

Further, a high resistance region 17 common to the plurality of structures is formed so as to be in contact with the both side surfaces and the bottom surface connected thereto, excluding the one main surface 11a side of the semiconductor substrate 11, of the P− type semiconductor portion (second concentration portion) 14b in each structure. The high resistance portion 17 includes an N− type semiconductor. Then, the high resistance portion 17 is configured to be gradually reduced in thickness so as to be rounded toward the periphery side of the semiconductor substrate 11.

Figure 11:
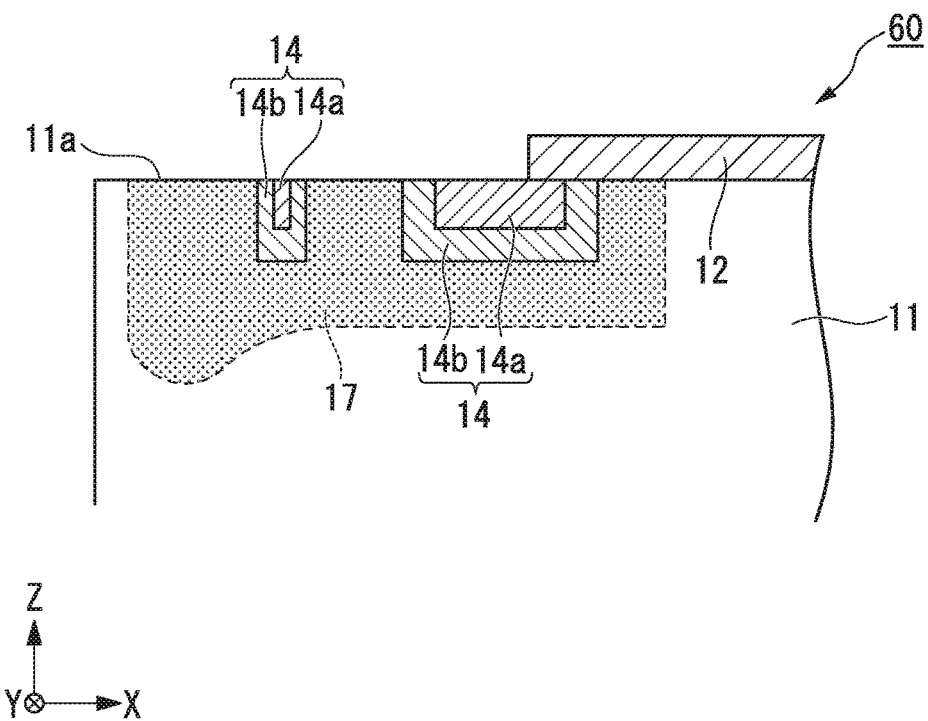
FIG. 11 is an enlarged cross-sectional view showing a principal portion of a periphery region of another embodiment of the Schottky barrier diode according to the present invention.

A configuration of a Schottky barrier diode 60 shown in FIG. 11 is the same in part as the configuration of the Schottky barrier diode 50 shown in FIG. 10. In the Schottky barrier diode 60, the high resistance portion 17 at the end part of the periphery region of the semiconductor substrate 11 along the X-axis direction is configured to be increased in thickness so as to be rounded toward a position a predetermined distance away from the periphery side of the semiconductor substrate 11.

Figure 12:
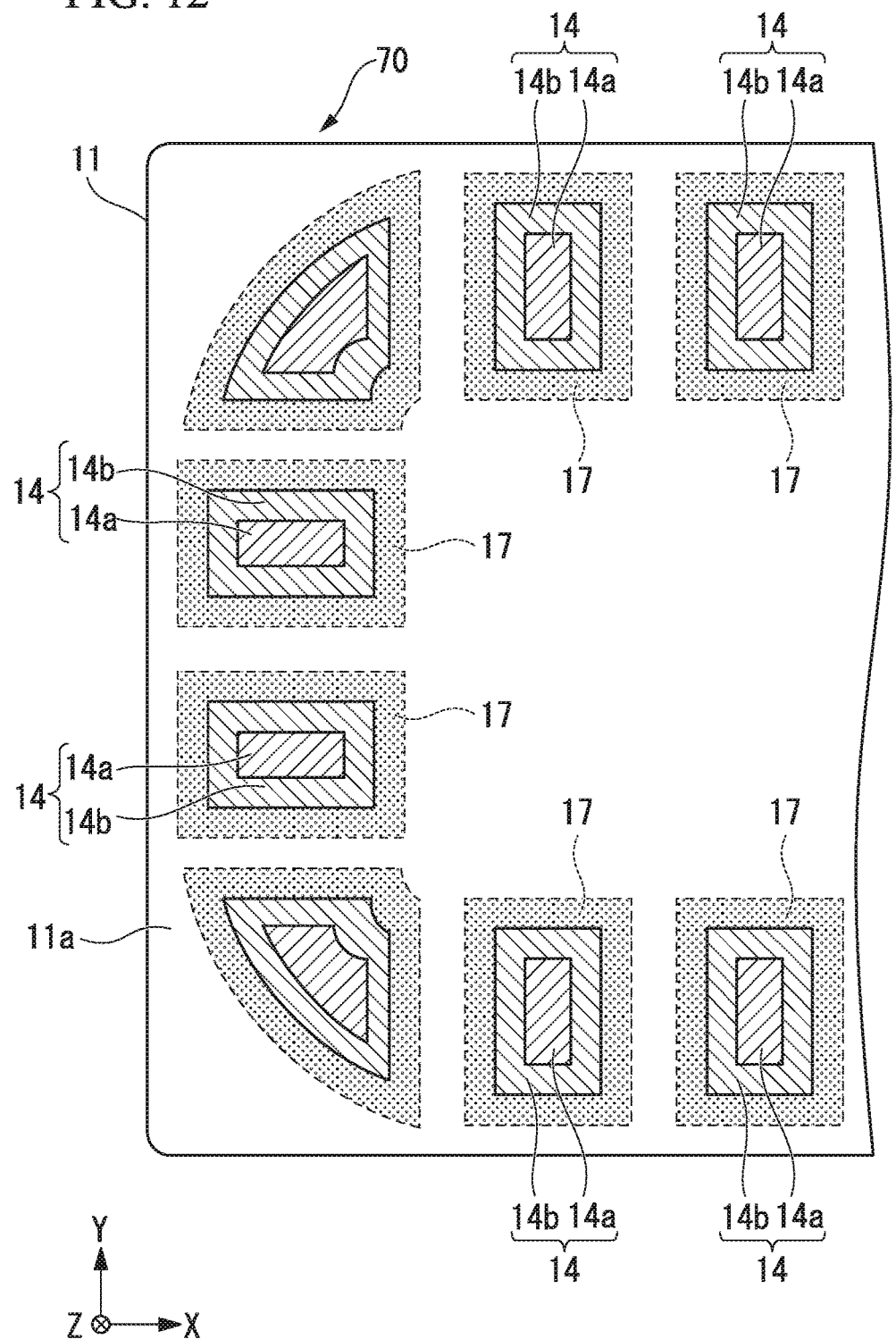
FIG. 12 is an enlarged plan view showing a principal portion of a periphery region of another embodiment of the Schottky barrier diode according to the present invention.

In a Schottky barrier diode 70 shown in FIG. 12, when the one main surface 11a of the semiconductor substrate 11 is planarly viewed from the above (X-axis direction and the Y-axis direction), a plurality of island-shaped structures each including the P+ type semiconductor portion (first concentration portion) 14a, the P− type semiconductor portion (second concentration portion) 14b, and the high resistance portion 17 are arranged along the periphery side of the semiconductor substrate 11.

Example

Hereinafter, examples where the effects of the present invention were verified are shown in comparison with the conventional examples.

In the present verification, a current flow and an increase in temperature in the periphery region of the substrate in the case of performing the PRSM test was simulated as an index of the inverse surge resistance.

Figure 3:
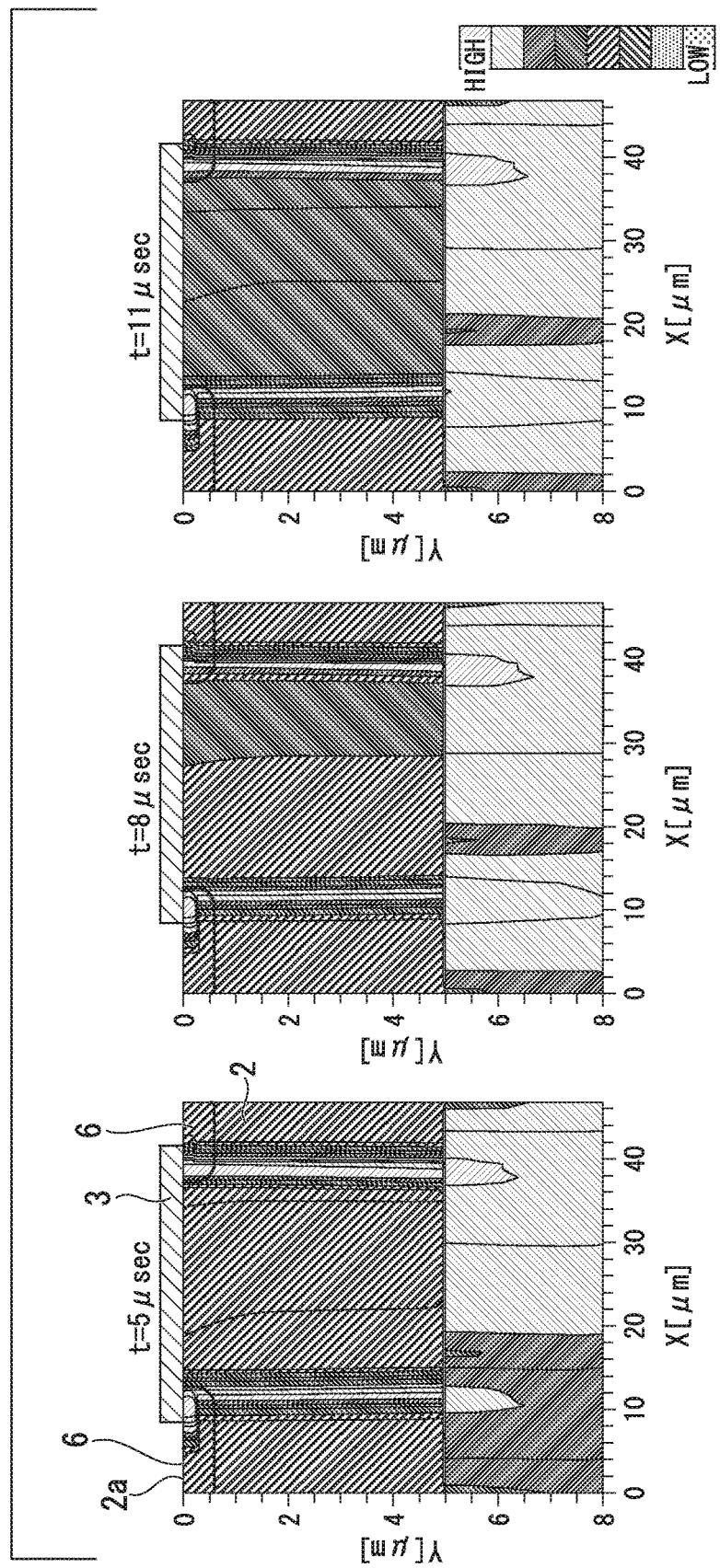
FIG. 3 is a distribution diagram showing a flow of a current in a periphery region of a substrate in a case where a PRSM (rated surge reverse power) test is performed on a conventional JBS (junction barrier Schottky) diode.
Figure 4:
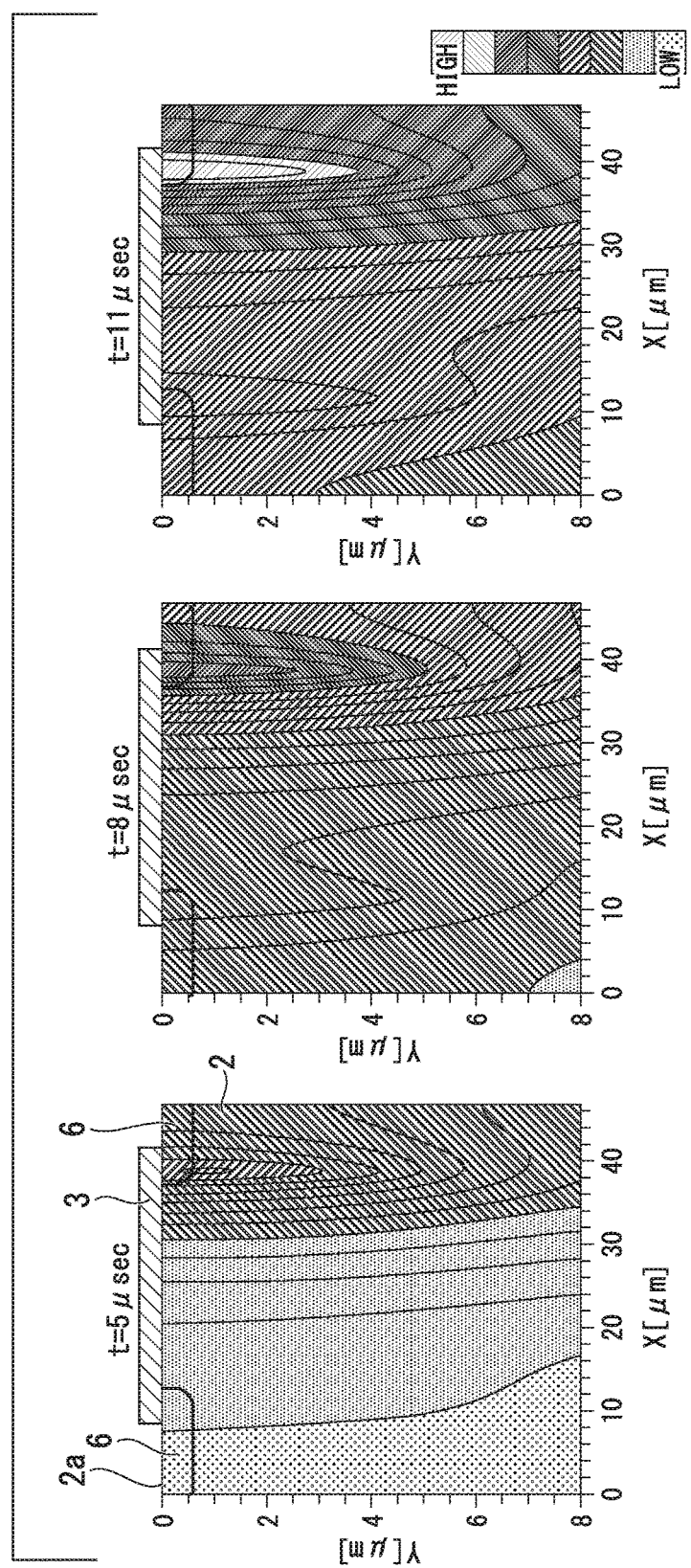
FIG. 4 is a distribution diagram showing an increase in temperature in the periphery region of the substrate in a case where the conventional PRSM test is performed on the conventional JBS diode.
Figure 7:
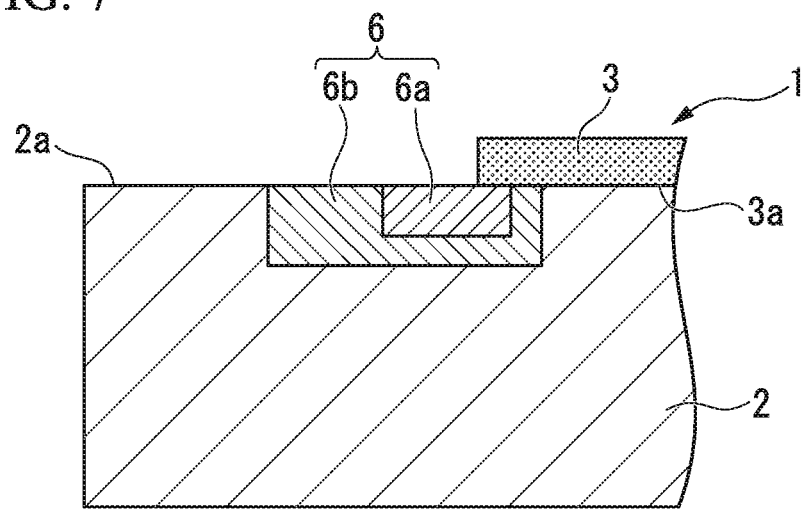
FIG. 7 is an enlarged cross-sectional view showing a principal portion of the periphery region of the conventional Schottky barrier diode.

FIG. 3 and FIG. 4 are distribution diagrams showing a flow of the current in the periphery region of the substrate (FIG. 3) and a distribution of an increase in temperature (FIG. 4) along with the elapsed time (5 μsec, 8 μsec, 20 μsec), in the case of performing the PRSM test on the Schottky barrier diode with the conventional JBS structure shown in FIG. 7, as a conventional example.

The distribution diagrams shown in FIG. 3 and FIG. 4 show the metal layer 3 on the top center and the guard ring 6 on both sides thereof. The Schottky barrier diode shown in FIG. 3 and FIG. 4 corresponds to the conventional Schottky barrier diode shown in FIG. 7.

According to the results of the simulation shown in FIG. 3 and FIG. 4, even when 5 μsec, 8 μsec, and 11 μsec elapsed after the time the test was started, the current flow did not spread throughout the entire Schottky junction surface in the X-axis direction and the Y-axis directions, and instead concentrated at a portion where the guard ring 6 was formed (FIG. 3). Then, since the current flow did not spread throughout the entire Schottky junction surface in the X-axis direction and the Y-axis direction, as 5 μsec, 8 μsec, and 11 μsec elapsed after the time the test was started, the temperature around the guard ring 6 in the semiconductor substrate was greatly increased by the concentration of current (FIG. 4). The temperature around the guard ring 6 of the semiconductor substrate became 600 to 700° C. at the highest portion.

Here, the rated surge reverse power was 0.1 kw to 0.2 kw.

Figure 5:
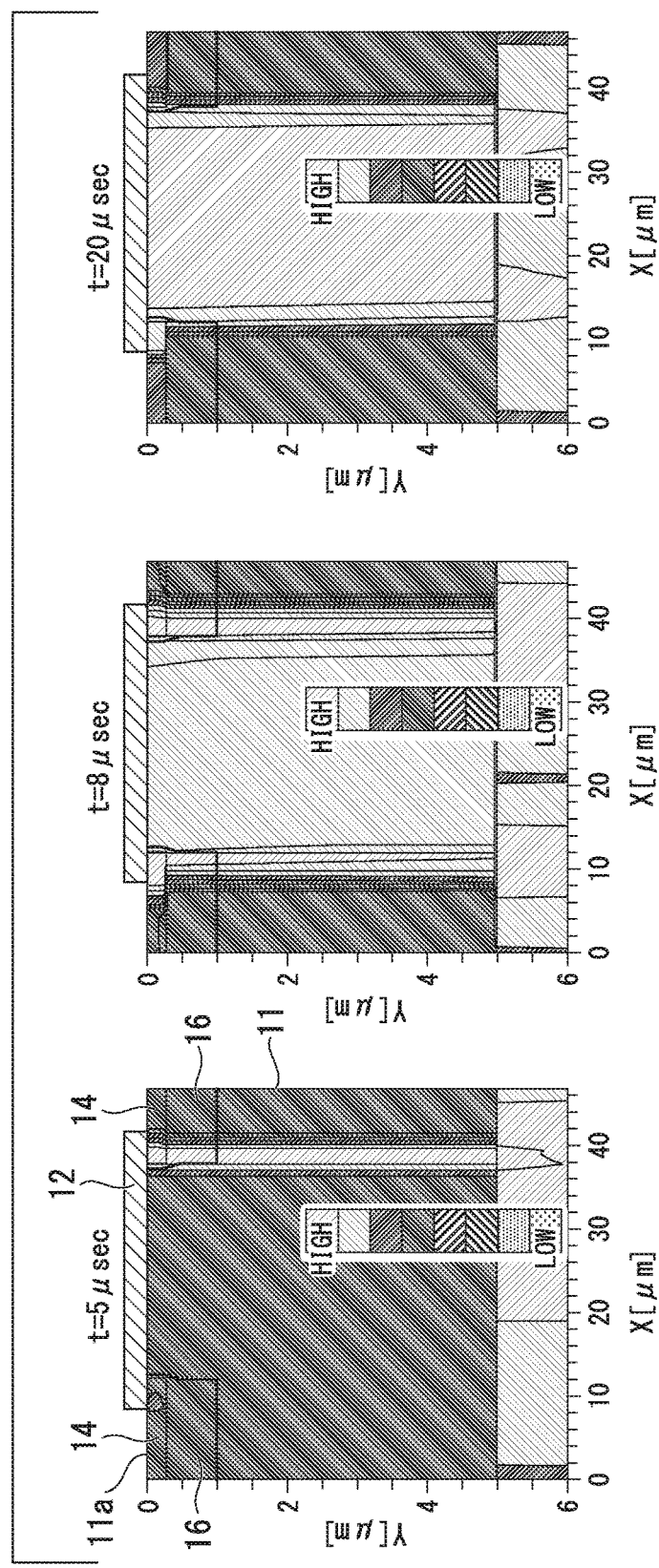
FIG. 5 is a distribution diagram showing a flow of a current in the periphery region of the substrate in a case where the PRSM test is performed on the Schottky barrier diode according to the present invention.
Figure 6:
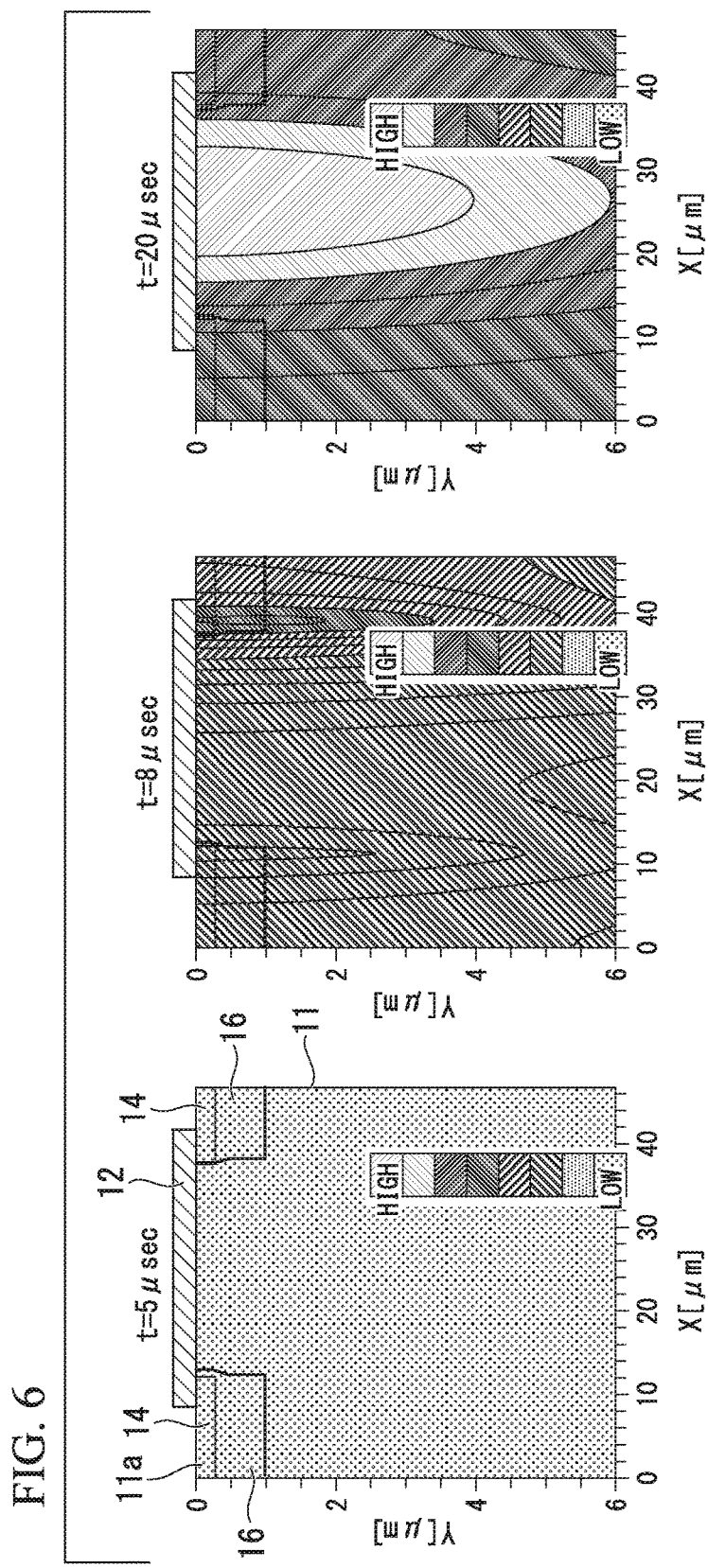
FIG. 6 is a distribution diagram showing an increase in temperature in the periphery region of the substrate in a case where the PRSM test is performed on the Schottky barrier diode according to the present invention.

FIG. 5 and FIG. 6 are distribution diagrams showing a flow of the current in the periphery region of the substrate (FIG. 5) and a distribution of an increase in temperature (FIG. 6) along with the elapsed time (5 μsec, 8 μsec, 20 μsec), in the case of similarly performing the rated surge reverse power (PRSM) test on the Schottky barrier diode (semiconductor device) shown in FIG. 1(a), as an example of the present invention. Here, it was assumed in the Schottky barrier diode of the present example that the high resistance portion 16 including the P− type semiconductor covering the side and bottom surfaces of the P+ type semiconductor portion 14 was formed. The distribution diagrams shown in FIGS. 5 and 6 show the metal portion 12 on the top center and the P type semiconductor portion 14 as the guard ring on both sides thereof. The Schottky barrier diode shown in FIGS. 5 and 6 corresponds to the Schottky barrier diode of the present invention shown in FIG. 1(a).

According to the results shown in FIG. 6, as 5 μsec, 8 μsec, and 11 μsec elapsed after the time the test was started, the current flow spread throughout the entire Schottky junction surface on which the metal portion 12 was formed, and the concentration of the current on the P type semiconductor portion 14 was alleviated. Along with the spread of the current flow throughout the entire Schottky junction surface, the temperature distribution of the entire Schottky junction surface was uniformed. As a result, the increase in temperature around the P type semiconductor portion 14 was alleviated, as compared to the conventional example shown in FIGS. 3 and 4 (FIG. 6). The temperature around the guard ring 6 of the semiconductor substrate was reduced by approximately 50 to 100° C. (FIG. 6), as compared to the conventional example shown in FIG. 4.

The results of the simulation obtained from the above results were that the conventional Schottky barrier diode is likely to be deteriorated in characteristics due to the increase in temperature around the guard ring, while the Schottky barrier diode of the present invention was not subject to the deterioration of the characteristics because of the homogenization of the temperature distribution throughout the entire Schottky junction surface. Additionally, the rated surge reverse power was 1 kw to 2 kw, and thus was greatly improved over the prior example.

DESCRIPTION OF REFERENCE NUMERALS

10 . . . Schottky barrier diode (semiconductor device), 11 . . . semiconductor substrate, 12 . . . metal portion (second portion), 14 . . . P type semiconductor portion (first portion), 14a P+ type semiconductor portion (first concentration portion), 14b P− type semiconductor portion (second concentration portion), 16 . . . high concentration portion (third portion: P− type semiconductor), 17 . . . high concentration portion (third portion: N− type semiconductor)

The invention claimed is:
1. A semiconductor device comprising:
a semiconductor substrate of a first conductivity type;
a first portion of a second conductivity type opposite to the first conductivity type, the first portion being formed on a part of a one main surface side of the semiconductor substrate; and a second portion with conductivity forming a Schottky junction with the one main surface side of the semiconductor substrate so as to be electrically connected to a part of the first portion, wherein the first portion comprises a first concentration portion and a second concentration portion which have different impurity concentrations from each other, the first concentration portion and the second concentration portion are formed on a part of the one main surface of the semiconductor substrate, and a side surface of the first concentration portion is in contact with a side surface of the second concentration portion, the semiconductor device further comprises:

a third portion formed so as to be electrically connected to a part of the second portion, the third portion being formed so as to be in contact with a side surface and a bottom surface connected thereto of the first portion, and the third portion is an intrinsic portion greater in electrical resistance value than the first portion.

2. The semiconductor device according to claim 1, wherein an entire side surface of one of the first concentration portion and the second concentration portion is in contact with a part of the side surface of the other one of the first concentration portion and the second concentration portion.

3. The semiconductor device according to claim 1, wherein the semiconductor substrate is an N type semiconductor,
the first concentration portion is a P+ type semiconductor,
the second concentration portion is a P− type semiconductor, and the third portion is any one of a P− type semiconductor, an N− type semiconductor, and an I type semiconductor.

4. A semiconductor device comprising:

a semiconductor substrate of a first conductivity type;

a first portion of a second conductivity type opposite to the first conductivity type, the first portion being formed on a part of a one main surface side of the semiconductor substrate; and a second portion with conductivity forming a Schottky junction with the one main surface side of the semiconductor substrate so as to be electrically connected to a part of the first portion, wherein the semiconductor substrate is made of silicon carbide, the semiconductor device further comprises:

a third portion formed so as to be electrically connected to a part of the second portion, the third portion being formed so as to be in contact with a side surface and a bottom surface connected thereto of the first portion, and the third portion is of the first conductivity type or the second conductivity type, and the third portion having an impurity concentration whose range is larger than 0, and less than or equal to $1 \times 10^{14}$ cm$^{-3}$.

5. The semiconductor device according to claim 1, wherein the third portion is gradually reduced in thickness so as to be rounded toward a periphery side of the semiconductor substrate.

6. The semiconductor device according to claim 4, wherein the third portion is gradually reduced in thickness so as to be rounded toward a periphery side of the semiconductor substrate.

* * * * *